United States Patent [19]
Doehler et al.

[11] Patent Number: 5,093,149
[45] Date of Patent: * Mar. 3, 1992

[54] METHOD OF DEPOSITING DIRECTLY ACTIVATED SPECIES ONTO A REMOTELY LOCATED SUBSTRATE

[75] Inventors: Joachim Doehler, Union Lake; Stephen J. Hudgens, Southfield; Stanford R. Ovshinsky, Bloomfield Hills; Lester R. Peedin, Oak Park; Jeffrey M. Krisko, Highland, all of Mich.

[73] Assignee: Energy Conversion Devices, Inc., Troy, Mich.

[*] Notice: The portion of the term of this patent subsequent to Jun. 26, 2007 has been disclaimed.

[21] Appl. No.: 520,988

[22] Filed: May 7, 1990

Related U.S. Application Data

[63] Continuation of Ser. No. 329,240, Mar. 24, 1989, abandoned, which is a continuation-in-part of Ser. No. 199,062, May 26, 1988, abandoned.

[51] Int. Cl.$^5$ ............................................. B05D 3/06
[52] U.S. Cl. ..................................... 427/38; 427/451; 427/47; 427/294
[58] Field of Search .................... 427/38, 294, 45.1, 47

[56] References Cited

U.S. PATENT DOCUMENTS
4,937,094 6/1990 Doehler et al .................. 427/45.1

Primary Examiner—Bernard Pianalto
Attorney, Agent, or Firm—Marvin S. Siskind

[57] ABSTRACT

A method of depositing high quality thin film at a high rate of deposition through the formation of a high flux of activated precursor species of a precursor deposition gas by employing a substantial pressure differential between the pressure adjacent the aperture in a conduit from which said precursor deposition gas is introduced into the interior of a vacuumized enclosure and the background pressure which exits in said enclosure. As the precursor deposition gas is introduced into said enclosure, a high density plume of said activated precursor species are formed therefrom due to an electromagnetic field established in an activation region adjacent said aperture. The pressure differential is sufficient to cause those activated precursor species to be deposited upon a remotely positioned substrate. In order to obtain a sufficient pressure differential, it is preferred that the flow of the precursor deposition gas reaches transonic velocity. And in order to obtain a high quality thin film, it is preferred that the plume of activated precursor species is spaced from the substrate; without structural or electrical confinement, a distance from the activation region greater than the mean free path of undesired activated precursor species and within the mean free path of desired species.

65 Claims, 4 Drawing Sheets

A.D. McDONALD & S.C. BROWN PHYS REV. 75 41 (1949)

METHOD OF DEPOSITING DIRECTLY ACTIVATED SPECIES ONTO A REMOTELY LOCATED SUBSTRATE

CROSS-REFERENCE TO RELATED APPLICATIONS

This application is a continuation of application Ser. No. 329,240, filed on Mar. 24, 1989.

This patent application is a continuation-in-part of commonly assigned U.S. Pat. application Ser. No. 199,062 filed May 26, 1988, the disclosure of which is hereby incorporated by reference.

FIELD OF THE INVENTION

The instant invention relates generally to the deposition of thin films of material through the generation of activated species of a precursor deposition gas adjacent the apertured end of a conduit through which the gas is introduced into an evacuated enclosure. More particularly, the instant invention relates to a method of generating a high density of desired energized species for the direct deposition of thin films of material onto the surface of a remotely located substrate. Whereas, it has previously been possible to either deposit relatively poor quality material (such as semiconductor alloy material, dielectric material or diamond-like material) at a relatively high rate of deposition, or to deposit relatively high quality material at a relatively low rate of deposition; the concepts disclosed by the instant invention make it possible to deposit high quality thin film material at very high rates of deposition.

Note that, as used herein, the term "precursor deposition gas" will refer to a gaseous precursor which is adapted to be activated (from a plasma) by an external source of energy for generating activated precursor species therefrom and transferring the energy thereof to the preferential formation of desired deposition species for deposition upon the surface of a remotely located substrate. In light of this definition, the inventive process disclosed herein, in its broadest form, relates to the ability to generate a plasma of activated species from a relatively high percentage of the precursor deposition gas flowing through an activation region and transmitting a high flux of those activated species to a remotely located substrate, i.e., a substrate spacedly disposed from the plasma.

BACKGROUND OF THE INVENTION

Well respected researchers in the field of amorphous silicon alloy materials espouse the theory that an inherent limitation exists as to the rate at which high quality amorphous silicon alloy material can be grown. As used herein, high quality amorphous silicon material will be defined as material which exhibits a low density of electronic defect states in the forbidden band gap thereof so as to provide for good electrical characteristics (such as high photoconductivity, low dark conductivity ability to be doped by the addition of impurity atoms).

In 1987, Tsai, Shaw, Wacker and Knights of Xerox PARC published a paper entitled "Film Growth Mechanisms Of Amorphous Silicon In Diode And Triode Glow Discharge Systems" in *Materials Research Society Symposium Proceedings.* Vol. 95, p. 219. These researchers drew a distinction between the deposition of amorphous silicon by (a) chemical vapor deposition (CVD) processes, which processes are rate limited by a surface reaction causing conformal step coverage and are produced by low sticking coefficient plasma deposition species such as $SiH_3$; and (b) physical vapor deposition (PVD) processes, which processes are not surface reaction rate limited and are produced by high sticking coefficient plasma deposition species such as $SiH_2$ and $SiH$. PVD processes result in poor step coverage and strong columnar morphology, and, the authors argue, give rise to films with high density of electronic defects.

The Xerox PARC paper found the deposition of high quality, non-columnar amorphous silicon alloy material, would, therefore, occur at low rates of deposition utilizing CVD-type processes, while low quality, strongly columnar amorphous silicon alloy material would occur at high rates of deposition utilizing PVD-type processes. The authors showed that by moving the substrate farther away from the plasma (using a triode deposition apparatus), species with longer lifetimes (lower sticking coefficients) are preferentially deposited because more of the high sticking coefficient species are eliminated by gas phase collisions. $SiH_3$ free radical species had been earlier known to be either the dominant free radical or the primary mass transporting species under plasma conditions tailored for the deposition of device quality amorphous silicon. Since the effective sticking coefficient is defined as the probability that the mass transporting species contribute to the film growth, it represents the net effect of complicated reactions involved in the deposition of amorphous silicon films (such as incorporation, dissociation, re-emission, etching, hydrogen elimination, etc.). Xerox PARC thus conclude that microscopically different mass transporting species are associated with PVD and CVD processes; $SiH_2$ and $SiH$ species dominate PVD growth while $SiH_3$ species dominate CVD growth. They state: ". . . There seems to be a limitation as to how fast one can grow good quality a-Si:H by plasma deposition[.]" and further ". . . [t]here seems to be an incompatibility between good material quality and fast growth rate in the plasma deposition of amorphous silicon . . . "

The inventors of the subject matter disclosed herein present results which demonstrate that this conclusion reached by the Xerox PARC group, as well as other researchers in the field is erroneous. Specifically, the instant inventors demonstrate that no fundamental incompatibility exists between the high rate of deposition of amorphous silicon alloy material and the high quality of that material. As a matter of fact, the instant inventors will present experimental proof that, by utilizing the novel processing techniques described herein, the electronic quality of the depositing amorphous silicon alloy material actually increase with a corresponding increase in the rate of deposition thereof under some conditions.

CHEMICAL VAPOR DEPOSITION (CVD)

Chemical vapor deposition is a process in which a substrate is coated with vapors of volatile chemical compounds at a temperature below the melting point of the substrate. The precursor compound is reduced or dissociated, in a chemical reaction on the substrate surface, thereby resulting in an adherent coating deposited on the substrate. The advantages of the process include the deposition of coatings varying in thickness from the ultra thin i.e., 10's of Angstroms up to thicknesses of many millimeters. The main disadvantage inherent in CVD is the necessity of heating the surface of the substrate to be coated to high temperatures. This has the effect of limiting the choice of substrate material, which can have profound consequences to manufacturing costs of thin film products, and can in fact have deleterious effects upon the quality of the deposited species. Commercially, CVD is used to produce epitaxially grown single crystal silicon by the reduction of silicon tetrachloride with hydrogen and to make epitaxial compounds, polysilicon, silicon nitride, silicon dioxide, and doped polysilicon and silicon dioxide.

1. Shock Wave-induced Reactions: Shock wave-induced reactions between relatively simple elements and molecules have been carried out in small scale laboratory settings. Shock waves are fully developed compression waves of large amplitude, across which density, pressure and particle velocity change drastically. Experimentation with shock wave-induced reactions has demonstrated coupling between vibrational excitation and reaction rate for a variety of bimolecular reactions, non-Arrhenius behavior of rate constant expressions and participation of radical-radical processes in decomposition and isotope exchange reactions.

While shock wave-induced reactions have proven quite useful as a tool for studying reaction mechanisms and elementary reaction rate constants, there has to date been no large scale use of them for commercially viable processes. Unfortunately, very little work has been done which would advance shock wave technology beyond the stage of laboratory curiosity. Thus, while shock wave-induced reactions have provided an excellent means by which to observe excitation and reaction of various bimolecular compounds, it is wholly unsatisfactory for the task of decomposing gases for subsequent chemical vapor deposition upon the exposed surface of a substrate.

2. R. F. Glow Discharge: At elevated temperatures or under reduced pressures, gases will conduct electricity when subjected to a strong electrical field. Under these conditions, gas becomes partially ionized and the free electrons and ions contained therein carry current. In a glow discharge, the free electrons in the electrical field collide with gas molecules and transfer energy thereto. Electron-molecule collisions result in molecular excitation and in dissociation and ionization of the gas molecules. Free radicals, positive and negative ions are formed and ultraviolet, visible and infrared radiation is emitted. The CVD process then proceeds with the deposition of films produced by the reaction of these species upon the exposed surface of a substrate. Often this surface CVD reaction can occur at lower temperatures than could be used to deposit films from the gas precursors of these plasma excited species. While the r.f. glow discharge deposition of thin films of inorganic materials has proven commercially effective, there are several crucial factors which limit the utility of glow discharge deposition. These factors will be discussed in depth hereinbelow.

R. F. glow discharge has also been successfully employed in the preparation of thin organic polymeric films. When an organic substance in the vapor phase is excited to luminescence by an electric discharge, a solid film tends to deposit on all surfaces exposed to the plasma. In a typical glow discharge polymerization process, the deposition chamber is first evacuated to a pressure of about $7.5 \times 10^{-3}$ torr Argon is then introduced into the chamber while the pressure increases to about $10^{-1}$ torr. The source of r.f. energy is activated and the power level is adjusted to 250 watts so as to provide a brilliant violet plasma. A flow of the precursor monomer gas is initiated and adjusted until the glow is quenched just at the surface of the substrate to be coated.

R.F. glow discharge has consistently demonstrated the ability to provide the highest quality (as measured in defect density) of deposited thin films of amorphous semiconductor alloy material. Despite the relatively low defect density present in the energy gap of r.f. glow discharge deposited silicon alloy material, said defect density remains orders of magnitude higher than the defect density of crystalline silicon. This is particularly true in terms of narrow band gap semiconductor alloy materials fabricated from silicon:germanium alloys wherein (in the best 1.35–1.65 eV material) the density of localized defect states in the energy gap still remains in the mid-$10^{16}$ defects/cm$^3$/eV range. Of course, in order to obtain high quality silicon alloy material exhibiting even this relatively high defect density, it is necessary to introduce different, but complementary compensating elements into the glow discharge plasma. Further, and very importantly, regardless of the power employed, if material quality must be considered, the rate of deposition remains low (less than 15 Angstroms/second). It has been demonstrated that the introduction of a first compensating element, such as hydrogen, is effective in reducing the localized states in the energy gap of silicon alloy material at or near the Fermi level, while the introduction of a second compensating element, such as fluorine, may further reduce those localized states, as well as other states, between those near the Fermi level and the conduction band. Due to the relatively low energy imparted by any r.f. field, regardless of the power level employed, to the plasma of decomposed precursor gases, the rate of deposition remains relatively low. This relatively slow deposition rate provides the hydrogen and/or fluorine compensating elements with a sufficient length of time to be able to react with the depositing host matrix and relax dangling, broken, stressed, or strained bonds in the narrow band gap silicon germanium alloy material as that material is depositing on the surface of said substrate.

However, in a commercial fabrication process, a significant problem exists in the deposition of high quality silicon alloy material. When the rate of deposition of the silicon alloy material (and indeed the deposition rate of any semiconductor or insulating material) is raised in order to deposit that material in a commercially economical manner, the quality deteriorates. More particularly, whenever the rate of deposition of silicon alloy material has been increased, from as little as 10 Angstroms per second to 12 Angstroms per second, as by increasing the r.f. power being utilized, a more energetic plasma is achieved. This more energetic plasma either changes the plasma reaction kinetics to produce a different set of ions and free radicals, or that energetic plasma fails to allot the compensating elements a sufficient period of time in which to interact with the host matrix of the depositing silicon alloy material for relaxing the strained, broken, dangling, stressed or otherwise deviant bonding configurations thereof.

Before continuing, it will be helpful to briefly consider some of the plasma kinetics which occur in r.f. or microwave initiated glow discharges. Experimental observations of the electronic defect density of multi-element amorphous silicon alloy films deposited from a great number of different gas chemistries (using both r.f. and microwave energy) reveal that thin films deposited from combinations of precursor gases having comparable individual "deposition efficiencies" exhibit the highest quality electronic properties. Based upon those observations, it becomes possible to modify the characteristics of the deposited thin film material. However, the degree of modification possible is limited because of the uncontrollable chemistry provided by the "zoo" of chemical reactions generated in the highly energetic plasma. More particularly, in the plasma, the precursor feedstock gases experience multiple collisions with plasma electrons to generate a host of free radicals and ions. The most attention must be paid to the free radicals which have been generated because they represent the plasma species which is deposited.

With respect thereto, there exists a distribution of free radicals depending upon the electron temperature, the electron density and the residence time of the gaseous precursor exposed to the electromagnetic field. The residence time dependence results from multiple electron collisions or collisions between previously excited free radicals and feedstock molecules or between two or more free radicals. In a silane feedstock plasma, the lowest energy member of the possible free radicals which can be generated is $SiH_3^*$, with higher energy members including $SiH_2^*$, $SiH^*$ and $Si^*$.

Since a plasma, in order to be self-sustaining, must contain electrons with sufficient energy to generate ions via collisions with feedstock molecules, and due to the fact that the energy required to generate an ion is generally higher than the energy required to generate the lowest energy member of the free radical spectrum (This assumption will be revisited in the portion of the instant specification which deals with the effect of a magnetic field on the deposition process of this invention.), it is reasonable to assume that a distribution of free radicals will be created in any plasma (the breadth of the distribution being dependent upon the power absorbed by the plasma).

Considering now the process by which thin films are grown in a plasma deposition process, it can be assumed that the depositing gaseous mixture is a compound which comprises n SCCM of molecule A and m SCCM of molecule B. It is further possible to assume that a fraction of A molecules ($ETA_A$) are converted to depositing free radicals which diffuse to and "stick" on the substrate. There exists a similar "deposition efficiency" coefficient for B molecules ($ETA_B$). Therefore at a given a.c. power density, a mixture of $n(ETA_A) + m(ETA_B)$ will be available for deposition (where both $ETA_A$ and $ETA_B$ are dependent on plasma power). This will result in the fabrication of a thin film of material, the composition of which can be varied by utilizing different combinations of plasma power densities or by changing the relative initial flow rates of feedstock gases (n/m). Alternatively, the same composition of depositing material can also be obtained from a given combination of feedstock gas by changing plasma power or by changing the ratio of flow rates of feedstocks gases (n/m).

From the previous discussion of plasma chemistry and kinetics, it should be appreciated that the problem of the deteriorating quality of depositing thin film material relative to an increase in a.c. power can be controlled (to some degree) when dealing with the relatively low power levels generated by r.f. energy. However, the ability to increase rates of deposition from 10 to 12 or even to 20 Angstroms per second is not commercially meaningful. Therefore, recently, researchers have sought to utilize microwave frequencies (including elaborate electron cyclotron resonance schemes) so as to obtain over one order of magnitude improvement in the rate of deposition of a wide variety of thin film materials. Through the use of a more energetic microwave initiated glow discharge, it becomes possible to obtain an increased rate of deposition through the more efficient disassociation of the gaseous precursors from which the plasma is formed. At the same time that the economics of the microwave initiated deposition process has been greatly enhanced by an increased rate of deposition, the quality of the depositing film has been correspondingly compromised. For example, the best microwave deposited silicon alloy material has a defect density about an order of magnitude higher than the defect density of the best corresponding r.f. deposited material, i.e., quality is sacrificed for quantity.

3. Microwave Glow Discharge: The assignee of the instant invention has previously described, in U.S. Pat. Nos. 4,504,518, 4,517,223, and 4,701,343, the disclosures of which are incorporated herein by reference, an important low pressure method by which high quality films can be deposited using microwave energy. This low pressure, microwave deposition process remains, up to the date of this invention, the most efficient and cost effective manner of depositing relatively high quality semiconductor, insulating, dielectric, or hard thin films. More particularly, the invention described therein relates to the use of a low pressure regime in which to initiate a glow discharge deposition, whereby the plasma is efficiently maintained, without polymer formation by operating at a substantial minimum of the "modified Paschen curve" for the given set of gaseous precursors being employed. This means that for a particular gaseous precursor mixture, there exists an optimum combination of power, pressure and aperture diameter which will sustain a plasma of a given volume. Following the inventive scheme disclosed therein, it is possible to both obtain a highly energetic plasma in which all process gases are disassociated and in which the rate of deposition is substantially increased, vis-a-vis, the rate of deposition of r.f. plasmas; both features accomplished while operating at a minimum input of power. Operation in this optimized power and pressure regime also results in the prevention of gas phase polymerization and powder formation. While the use of low pressure and minimum power provides for the deposition of the highest quality material yet reported for microwave glow discharge processes, that process still suffers from an inability to control the specific activated species generated within the plasma. Further, if one believes the conclusions drawn by the Xerox PARC group, discussed hereinabove, it is impossible to obtain high quality silicon alloy material at a high rate of deposition.

The two main points to bear in mind when discussing either the aforedescribed r.f. plasma glow discharge deposition methodology or the improvement thereover provided by the aforementioned low pressure microwave initiated glow discharge deposition methodology is that (1) in both of these plasma processes, material quality deteriorates relative to increases in the rate of deposition, and (2) it is impossible to control the kinetics of the gas phase chemistry in such a manner that the only species generated in the glow discharge plasma will be those species from which the highest possible quality of thin film material will be deposited.

4. Remote Plasma Excitation:

In the following paragraphs, there is described the present state of the art of depositing thin film materials from only desired precursor species by processes generally known as "remote plasma excitation". The term "remote plasma excitation", as used herein, refers to a process by which a gaseous precursor mixture is formed into a plasma of desired species in one region within a vacuumized chamber, which desired species are then directed to a region of said chamber remote from the point of plasma formation. Attention is specifically directed to the efforts of two of the most respected scientists in field of remote plasma excitation, Drs. G. Lucovsky and I. Shimizu. Dr. Lucovsky, at North Carolina State and Dr. Shimizu at the Tokyo Institute of Technology have conducted research directed toward the deposition of specifically preselected free radical species from a silicon-based plasma in order to obtain a silicon alloy film characterized by a low density of localized defect states in the energy gap thereof, excellent photoconductivity (the ratio of light to dark conductivity) and long charge carrier lifetimes.

The currently relevant commercial r.f. and microwave deposition techniques discussed hereinabove are characterized as "direct plasma enhanced chemical vapor deposition" processes. As used herein, "direct plasma enhanced chemical vapor deposition" will refer to a process by which a gaseous precursor mixture, containing, inter alia, the desired deposition species, is directly exposed to a source of excitation or fragmentation energy and the deposition species in the plasma thereby created are deposited onto a substrate proximately disposed relative thereto.

As used herein, the term "activated species" refer to microscopic objects which carry internal energy, whether atomic or molecular, free radicals, ions, or excited neutrals. With respect to remote plasma processes, this definition is to be contrasted with the use of the term by Dr. Lucovsky who believes that metastable, excited or non-ground state helium (He*) is generated when helium gas is exposed to the electromagnetic field. In contradistinction thereto, the instant inventors believe that the activated species are actually helium ions (due to an experimentally observed magnetic field dependency of the thin film deposition rate). However, the nature and characterization of those activated species is not critical to the operation of the method of the instant invention. Therefore, it is to be understood that the term "activated species" will refer generically to any of such activated species.

It must further be noted that the term "activation region" or "plume of activated species", as used herein, will refer to that volume of the evacuated enclosure in which the number of activated species which are generated by the electromagnetic field exceeds the number of activated species which are extinguished due to wall loss, collisions, etc.

In an attempt to remedy the shortcomings of high power direct plasma excitation, the two aforementioned groups of researchers (G. Lucovsky, et al at North Carolina State University and I. Shimizu, et al at Tokyo Institute of Technology) have conducted research aimed at developing non-direct plasma excitation processes wherein the deposition species are formed remotely of the plasma region. These non-direct processes involve; (1) the excitation of a first gaseous precursor (typically a noble gas), within at least a partially structurally confined (walled) activation region, to an activated species; (2) the transport of the activated metastable species from the structurally confined activation region, which is accomplished by allowing the activated species to "drift" from that activation region to a deposition region; (3) the downstream collision of the activated species with a precursor deposition gas, whereby the activated species and the precursor deposition gas collide and interact to form desired deposition species; and (4) the deposition of a thin film of material from those deposition species onto a substrate spaced within a mean free path therefrom.

Lucovsky, et al (see the Journal of Non-Crystalline Solids, 12th ICALS, Prague, 1987 for a paper by Lucovsky and Tsu entitled "Differences Between Direct And Remote Plasma Enhanced CVD") teach the deposition of a thin film of amorphous silicon hydrogen material by employing r.f. energy (13.56 MHz) to generate, in a structurally confined activation region, excited helium atoms (such as helium free radicals, He*), which activation region is spacedly disposed from a heated substrate by at least 10 cm. The excited helium free radicals then migrate from the plasma region to the vicinity of the substrate where they interact with neutral silane gas (diluted with 90% argon), which silane gas is introduced above the heated substrate by a "showerhead" gas ring. Dr. Lucovsky claims that the He* atoms collide with the $SiH_4$, resulting in the creation of deposition free radical species of the silane as given by the following reaction:

$$[He^*] + SiH_4 \rightarrow SiH_3 + H$$

In other words, the thermodynamics and collision kinetics of helium metastable species with silane neutrals is of the correct energy to favor the formation of $SiH_3$. subsequent reaction of the $SiH_3$ free radical with the heated substrate is believed to provide the highest electronic quality amorphous silicon alloy material. The noble gas atom, argon, has also been used in place of helium as the r.f. plasma activated metastable species. However, as reported from work done by Matsuda, et al, and confirmed by Lucovsky, argon initiates a different fragmentation of the silane, thereby causing plasma polymerization of $SiH_2$ and silane to disilane, trisilane, etc. The result is the creation of large amounts of polysilane powder as well as the deposition of the silicon alloy film.

These remote plasma excitation processes have also been employed for the deposition of thin films of silicon oxide ($SiO_x$) and silicon nitride ($SiN_x$) dielectric or insulating material. In the deposited dielectric films, the plasma of activated species typically includes about 20% $O_2$ or $N_2$ in He, depending upon the desired composition of the film to be deposited. These activated species are excited by an r.f. plasma so as to generate excited $(O_2, He)^*$ or a $(N_2He)^*$ metastable species. These activated metastable species then interact with $SiH_4$ (or other silicon-containing gas) as represented by the following unbalanced equations $$(O_2He)^* + SiH_4 \rightarrow SiO_2 \qquad \text{I.}$$

$$(N_2HE)^* + SiH_4 \rightarrow Si_3N_4 \qquad \text{II.}$$

thus depositing the thin films of silicon oxide or silicon nitride material upon a heated substrate.

Both of the aforedescribed thin films of dielectric materials and the thin films of semiconductor alloy materials are fabricated under substantially similar deposition conditions. More specifically, the energy transferring gas is introduced into the enclosure at a flow rate of between about 100 and 1000 SCCM; the gaseous silane precurso into the enclosure at a flow rate of approximately 5-25 SCCM; the deposition pressure within the enclosure is maintained at between about 300 mtorr and 1 torr; the applied r.f. power is maintained at about 5-50 watts; and the substrate temperature is maintained at about 40° to 400° Centigrade. These operating parameters, particularly the flow rates of both the energy transferring gas in the first conduit and the background pressure in the enclosure are considered necessary so that: (1) the diffusion of silane gas back into the structurally confined activation region is substantially minimized; and (2) an acceptable density of the activated species from the energy transferring gas is extracted from the structurally confined activation region and directed towards the silane gas dispersal ring.

It is very noteworthy that the aforementioned preferred flow rates and background pressure assure a mean free path for bimolecular collisions of a fraction of a millimeter, while the substrate is spacedly disposed approximately 5 centimeters from the collision region, i.e., the region in which, for instance, metastable He species, metastable $O_2$ species and $SiH_4$ molecule collide. However, the selected spatial arrangement yields a plurality of localized collisions between the aforementioned metastable species and the silane molecules before the material is deposited onto the substrate. Therefore, the material will be deposited from a flux of precursor which includes many different species as opposed to the single desired species. Additionally, the multiple collisions prevent a high density of the single desired species from being deposited onto the substrate. It is no wonder that the arrival rate of the desired free radical species must remain so low.

Turning now to the work of Dr. Shimizu, a modified process for semi-direct plasma excitation is described in a paper entitled "Growth Of Amorphous And Crystalline Silicon By HR-CVD (Hydrogen Radical Enhanced CVD) authored by Shibata, Fukuda, Ohtoshi, Hanna, Oda and Shimizu and published in Materials Research Symposium Proceedings, Volume 95, 1987, pp. 225-235. In this paper Shimizu, et al propose a novel technique for the preparation of Si-based alloys. It is important to recognize the fact that the Shimizu, et al technique employs "hybrid excitation" in which the precursor deposition gas is both directly and remotely activated. The direct excitation occurs through direct exposure to the electromagnetic field and the remote excitation occurs as a product of interaction of the partially excited deposition species with the activated metastable species of the energy transferring gas. In the described HR-CVD technique, it is essential that the precursor deposition gas be struck by activated species of an energy transferring gas to secondarily form $SiF_nH_m$ (where n+m is less than 4).

The apparatus of Shimizu, et al includes coaxial tubes, in the interior one of which $SiF_4$ is transported and in the exterior one of which hydrogen gas and argon gas is transported. The hydrogen gas is converted to atomic hydrogen through the direct exposure to a source of microwave energy. A second interconnected portion of the apparatus is a stainless steel deposition chamber in which a heated substrate is disposed. The $SiF_4$ is first directly exposed to the microwave energy in the interior tube and is secondarily exposed to the hydrogen plasma at the end of the inside tube to generate the deposition species. Typical deposition parameters are a $SiF_4$ flow of 45 SCCM, an Ar flow of 76 SCCM, an $H_2$ flow of 10 SCCM, a power of 440 watts at 2.45 GHz, and a background pressure of 300 millitorr. Not surprisingly, Shimizu, et al found the location of the exit of the inside tube as well as the distance thereof from the substrate to be important factors in determining the rate of deposition as well as the quality of the deposited film. Further, Shimizu, et al reported the presence of a negligible number of ionic species of the precursor deposition gas and therefore concluded that the free radical species of the precursor deposition gas formed the depositing species. Finally, note that Shimizu, et al obtain a rate of deposition of no more than 50 Angstroms per second; however, this relatively high deposition rate is attributable to the direct excitation of the precursor deposition gas. While this direct excitation resulted in drastically improved rates of deposition, the ability to control the nature of the depositing species and therefore the ability to maintain high electronic film quality was thereby forfeited.

Despite the extensive research conducted by Drs. Lucovsky and Shimizu, the goal of depositing high quality thin films at relatively high deposition rates has gone unfulfilled. Indeed, the truly remote plasma excitation processes thus far developed are capable of deposition rates of less than about 1 Angstrom per second of intrinsic amorphous silicon alloy material characterized by a density of defect states on the order of approximately $10^{16}$ to $10^{17}$ defects per $cm^{-3}$ per eV.

In the aforementioned parent of the instant patent application, it was reported that the parameters which earlier researchers deemed critical, (i.e., the flow rates of both the precursor deposition gas (such as $SiH_4$) and the energy transferring gas (such as He), the background pressure in the enclosure and the spacing of the substrate relative to the activation region (the region in which the energy transferring gas is activated) have been erroneously selected, and in fact prevent the rapid deposition of high quality thin film material in a remote excitation process. It was noted that while the spaced disposition of the activation region from the substrate is certainly effective in preventing back diffusion of precursor deposition species, such as silane, into the plasma of activated species; (1) the length of this "drift zone"; (2) the background pressure existing within the enclosure; and (3) the necessity of structurally enclosing the activation region, causes the density of He* species to rapidly decline as the distance of the activation region from the plasma region increases. To achieve the desired elimination of back diffusion with this technique, the distance must be increased to such an extent that an insufficient number of activated species arrive at the collision region to exhaust (collide with) 100% of the precursor deposition gas. The length of the "drift zone" and the structural confinement of the activation region necessarily results in an excessive number of He*-He* collisions and He*-to-wall collisions, which collisions reduce the number of metastable He available for interaction with the deposition precursor gas. Of course, as the number of collisions between the activated species of the energy transferring gas and the precursor deposition gas decrease, the number of deposition species available correspondingly decreases and therefore the film deposition rate drops.

The parent of the instant application disclosed a novel method of: (1) generating the highest possible number of activated species through the use of an intense microwave initiated glow discharge plasma; (2) transporting the activated species to the collision region, without losses occasioned by either wall or activated species collisions (through the use of a substantial pressure differential and the elimination of structural confinement of the activation region); (3) preventing the back diffusion of the precursor deposition gas from the collision region to the activation region (through the use of the substantial pressure differential and transonic velocity of the energy transferring gas in the first conduit); and (4) preventing multiple collisions of the energized deposition/etchant species with all other particles (through the use of an optimized background pressure to establish a desired mean free path).

Since the date of filing the parent of the instant application, research with remote plasma excitation CVD (RPECVD), in a system such as the one depicted in FIG. 1 of the patent application, has continued. During the course of this further research with remote plasma enhanced chemical vapor deposition the instant inventors noticed that, with the passage of time, the aperture end of the second conduit, i.e., the conduit from which the precursor deposition gas (such as $SiH_4$) was introduced into the collision region for activation into depositing species (such as $SiH_3$), became restricted. While the restricted aperture was actually due to the deposition or other accumulation of deposition species therewithin, the result was a resistance to the flow of said precursor deposition gas through the internally narrowed passage adjacent the aperture in the second conduit.

The instant inventors were surprised to find that, as the aperture of the second conduit became increasingly restricted, the deposition rate of the desired deposition species actually increased and that the increase in the rate of deposition continued with further constriction of that aperture (the deposition of additional material onto the interior wall) of the conduit. In fact, the deposition rate continued to increase until the flow of the viscous precursor deposition gas through the restricted aperture in the second conduit became choked, thereby reaching substantially transonic velocity. At the same time, the instant inventors varied the distance of the substrate relative to the plume of activated precursor species formed adjacent said aperture and it was determined that the substrate-to-plasma distance could be optimized (depending upon the flow rate of precursor deposition gas through the constricted aperture) to deposit high quality film.

It was at this point that the instant inventors deduced that the use of RPCVD processes was not critical to the ability to deposit high quality thin films at high rates of deposition. It was reasoned that by establishing a substantial pressure differential between the background pressure existing in the evacuated enclosure and the pressure adjacent the constricted aperture in the conduit through which the precursor deposition gas is introduced into the enclosure, they were moving down the left hand side of the modified Paschen curve (see FIG. 3) towards the minimum and thereby making it easier to strike and maintain a plasma from the precursor deposition gas (such as silane). Because of the shift toward the minimum of the Paschen curve, the energy transferring gas (He) was able to impart sufficient energy to the plasma deposition precursor gas (silane) for to initiating a sizable secondary plasma volume (initiated by the collision of He with the silane) and the deposition rate consequently increased. However, for activated deposition species so created, it was immaterial that they had been generated by a remote excitation process. Therefore, the inventors concluded that it should be possible to also achieve the same results through a direct excitation scheme in which the substrate-to-plasma distance would be varied in order to provide for the appropriate amount of inter-species and species-wall collisions for obtaining the desired deposition species. Based thereupon, they found that it was possible to directly excite the precursor deposition gas by a microwave energy source so as to produce a high density of activated deposition species (from the silane gas introduced at transonic velocity) as long as the distance and environment (pressure, magnetic fields, walls, etc.) maintained between the plume of activated precursor species and the substrate was appropriately selected. In this manner, high quality thin film material could be deposited at a high rate of deposition.

Specifically, it was found that the closer the substrate was disposed relative to the plume of activated precursor species, the poorer the quality of the deposited thin film material became. Conversely, as the substrate was moved farther from the plume of activated precursor species, the quality of the deposited thin film material increased. While not wishing to be bound by theory, the instant inventors hypothesize, that the desired deposition species (at least for a silane precursor deposition gas) are longer lived than other, undesired species; thus the desired species are not recombined or otherwise extinguished prior to deposition on the substrate. Further, it is believed that the selection of the longer substrate-to-plasma distance provides sufficient time for the undesired, shorter lived species to either collide with one another or the chamber walls, or recombine to form desired deposition species to be deposited onto the substrate.

The result is that the process set forth in the instant invention allows for greatly increased rates of deposition, improved quality of deposited materials, good gas utilization (eliminates the requirements of an energy transferring gas) and the ability to use high power microwave energy without compromising material quality.

BRIEF SUMMARY OF THE INVENTION

In a first major embodiment, there is disclosed herein a method of generating a high flux of activated deposition species from an energized precursor deposition gas. The method comprises the steps of providing an enclosure; maintaining the interior of said enclosure at subatmosphere background pressure; introducing a precursor deposition gas into the interior to said enclosure through at least one aperture formed in a conduit at a pressure which creates a substantial pressure differential between the pressure adjacent said aperture in said conduit and the background pressure in said chamber; activating said precursor deposition gas in a activation region so as to form a high density plume of activated precursor species; operatively disposing a substrate interiorly of the enclosure and spacedly located from the activation region; and establishing a flow of said precursor deposition gas adjacent said aperture in said conduit so as to define a substantially clear boundary of said plume without the structural confinement thereof.

The flow rate of the precursor deposition gas in the conduit is selected so as to provide a sufficient pressure of precursor deposition gas adjacent the aperture for initiating a plasma from the precursor deposition gas at a power-pressure-aperture size regime which is at the substantial minimum of the Paschen curve. The size of the aperture may be reduced relative to the size of the conduit so as to form a choke adjacent the aperture for providing the high pressure of said precursor deposition gas. The time of residency of the precursor deposition gas adjacent the aperture may be increased, as by decreasing the aperture size, so that the pressure of the precursor deposition gas adjacent the aperture is also increased. A cooling mechanism, such as a water jacket may be provided for the conduit. A protective sleeve, such as a graphite sleeve, is provided by which degradation of the surface of the conduit adjacent the aperture is reduced. The high density of activated precursor species are utilized to deposit material onto the substrate.

Either r. f. or microwave frequency may be utilized to activate the precursor deposition gas. When microwave energy is employed, a radiant microwave applicator is utilized to activate the precursor deposition gas flowing through the aperture in the conduit. Alternatively, the conduit may be formed from a material not transmissive to microwaves so that the activation species are primarily initiated exteriorly of the conduit.

As mentioned hereinabove, an electromagnetic field is applied to form the plume of activated species, the volume of the plume being controllable by controlling the pressure differential which exists between the background pressure in the enclosure and the pressure of the precursor deposition gas adjacent said aperture in the first conduit.

The background pressure in the enclosure is preferably maintained in the range of less than 50 torr. A flow rate of at least about 10 SCCM of the precursor deposition gas is preferably introduced to flow through the conduit and into the enclosure. In this manner, pressure isobars are maintained adjacent the aperture portion of the conduit of about one half the pressure at which the minimum of the Paschen curve for a given gas occurs. Preferably, the flow rate of the precursor deposition gas through the conduit relative to the background pressure which exists in the enclosure is selected to impart a velocity to the activated species of the precursor deposition gas of at least about the same magnitude as the thermal velocity thereof so that the activated deposition species are imparted with a directional velocity toward the spacedly disposed substrate. To most effectively impart such a velocity, it is necessary that the flow rate of the precursor deposition through the conduit be substantially transonic (near the velocity of sound so as to operate in a choke mode).

In a second major embodiment of the instant invention, there is disclosed a method of depositing a high quality thin film at a relatively high rate of deposition. The method includes the steps of providing an enclosure; maintaining the interior of the enclosure at subatmospheric background pressure; introducing a precursor deposition gas into the interior of the enclosure through at least one aperture formed in a conduit at a pressure at least a factor of five greater than said background pressure; activating the precursor deposition gas in an activation region so as to form a high density plume of activated precursor species; operatively disposing a substrate interiorly of the enclosure, said substrate spaced from said plume, whereby said activated precursor species react with one another prior to being deposited upon said substrate.

In the third major embodiment of the instant invention, there is disclosed a method of fabricating high quality thin film at a relatively high rate of deposition. The method includes the steps of providing an enclosure; maintaining the interior of the enclosure at subatmospheric background pressure; introducing a precursor deposition gas into the interior of the enclosure through at least one aperture formed in a conduit; activating the precursor deposition gas in an activation region so as to form a high density plume of activated precursor species; operatively disposing a substrate interiorly of the enclosure, said substrate spaced from said plume; and establishing a flow of said precursor deposition gas adjacent said aperture in the conduit at substantially transonic velocity.

The above-described and other objects, advantages and features of the instant invention will become more apparent upon reference to the Drawings, the Detailed Description Of The Drawings, and the claims which follow hereinafter.

DETAILED DESCRIPTION OF THE INVENTION

I. THE REACTION APPARATUS

Figure 1:
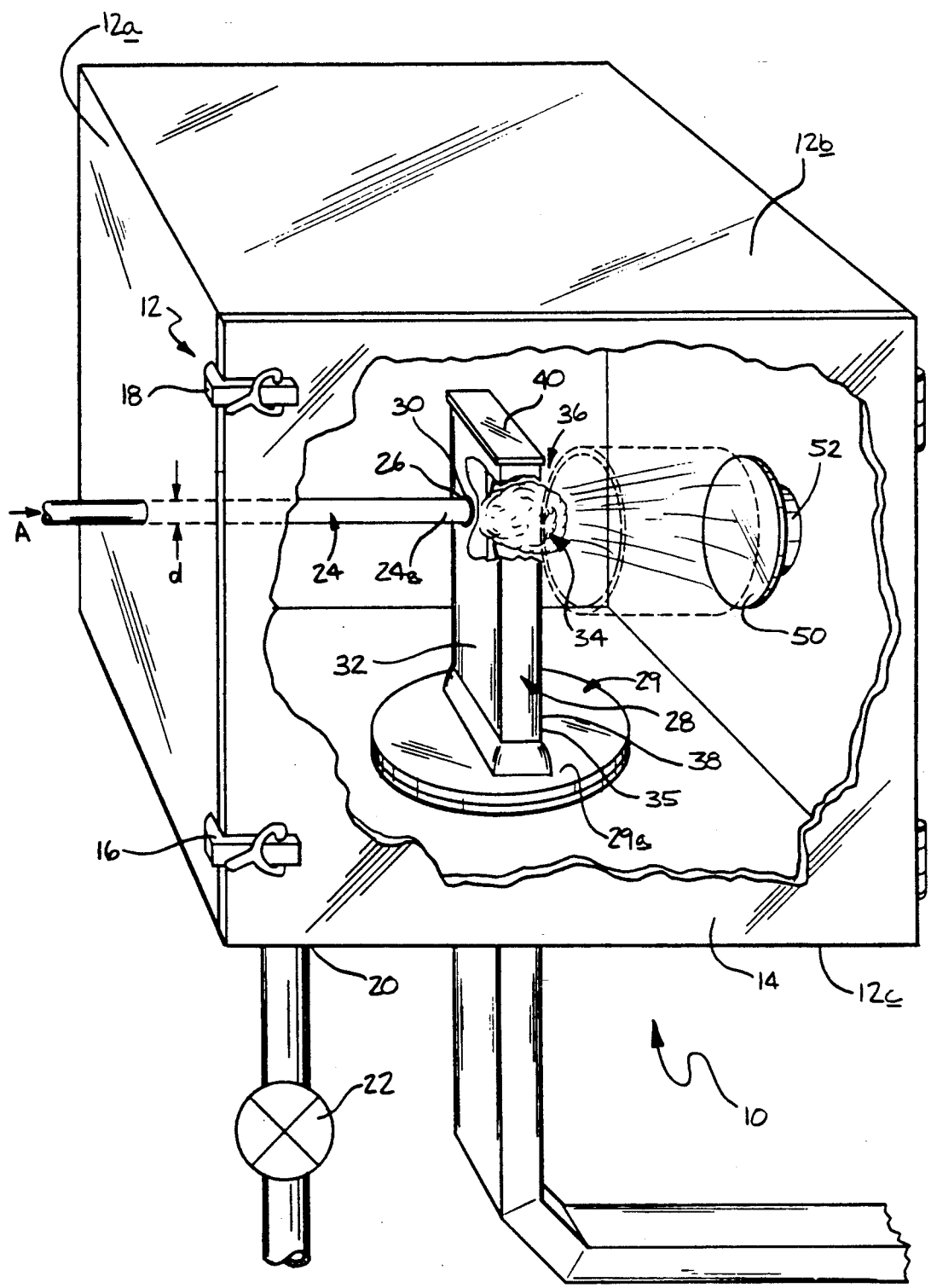
FIG. 1 is a perspective view, partially cut-away, illustrating the interior of the vacuumized enclosure of the instant invention, in which enclosure a plume of activated precursor species of a precursor deposition gas is directed onto the surface of a remotely positioned substrate.

Referring now to the drawings and particularly to FIG. 1, there is illustrated therein a perspective view, partially cut-away, of a reaction apparatus, generally indicated by the reference numeral 10. Functionally, the apparatus 10 is adapted to generate a plume of activated precursor species from a precursor deposition gas introduced into the interior thereof. The activated precursor species is directed through an interactive drift zone, whereby said activated species collide with one another to form desired deposition species. These deposition species will subsequently deposit relatively high quality, thin film layers of, for instance, silicon, germanium, carbon and combinations thereof, upon a substrate operatively disposed remotely of the plume.

The apparatus 10 as depicted in FIG. 1, includes a generally rectangularly shaped, hollow, vacuumizable enclosure 12. The enclosure 12 includes a pivotable front face 14 which functions as a door 14 for loading and removing substrates from the interior of the enclosure. The inner periphery of the door 14 is equipped with one or more vacuum seal rings (not shown) and one or more latches, such as 16 and 18, which latches are adapted to compress the seal rings for assuring an airtight closure between ambient conditions externally of the enclosure and vacuum conditions interiorly of said enclosure. The vacuumized enclosure 12 further includes a pump-out port 20 in the bottom wall 12c thereof adapted for connection to a powerful vacuum pump 22 which is employed to: (1) exhaust depleted reaction products from the hollow interior thereof; and (2) to maintain the interior of said enclosure 12 at an appropriate sub-atmospheric pressure. As will be explained in greater detail hereinafter, the background pressure will be carefully selected to initiate and sustain the high rate deposition process carried out interiorly of the enclosure.

The apparatus 10 further includes at least a first elongated conduit 24 of diameter d, wherein d is preferably between about 0.5 to 3.0 cm, extending through a side wall 12a into the interior of said vacuumized enclosure 12. The hollow conduit 24 includes at least one portion, the distal end 24a thereof, having an aperture 26 formed therein. The conduit 24 and the distal end 24a and aperture 26 thereof are adapted to, respectively, transmit and introduce a precursor deposition gas from a source (not shown) into the interior of said vacuumized enclosure 12, preferably to a point immediately adjacent apparatus adapted to provide activated species from said precursor deposition gas. In the preferred embodiment depicted in FIG. 1, the activation apparatus will take the form of a radiant microwave applicator 28, discussed in greater detail hereinbelow. In one preferred embodiment, the first conduit 24 is adapted to introduce a precursor deposition gas selected from the group consisting essentially of, but not limited, silicon-containing gas, germanium-containing gas, oxygen containing gas, carbon-containing gas, nitrogen-containing gas, n-dopant-containing gas, p-dopant containing gas, and combinations thereof. Specific examples of preferred precursor deposition gases include, but are not limited to, $SiH_4$, $SiF_4$, $Si_2H_6$, $GeH_4$, $Ge_2H_6$, $GeF_4$, $CH_4$, $C_2H_6$, and combinations thereof. Alternatively, the precursor deposition gas may be a precursor etchant gas such as $NF_3$, $CF_4$, fluorocarbons, chlorocarbons and combinations thereof.

Regardless of the composition of the precursor deposition gas employed, the aperture 26 formed at the distal end of the conduit 24 must be capable of delivering a selected flow rate (as measured in terms of SCCM, i.e., standard cubic centimeters per minute) of said precursor deposition gas. The flow rate is selected to provide a sufficient pressure of the precursor deposition gas adjacent said aperture 26 for initiating the activation of said precursor deposition gas at a power-pressure aperture size regime which is at the substantial minimum of the modified Paschen curve, (the details of the Paschen curve will be discussed hereinafter with respect to FIG. 4).

Figure 2:
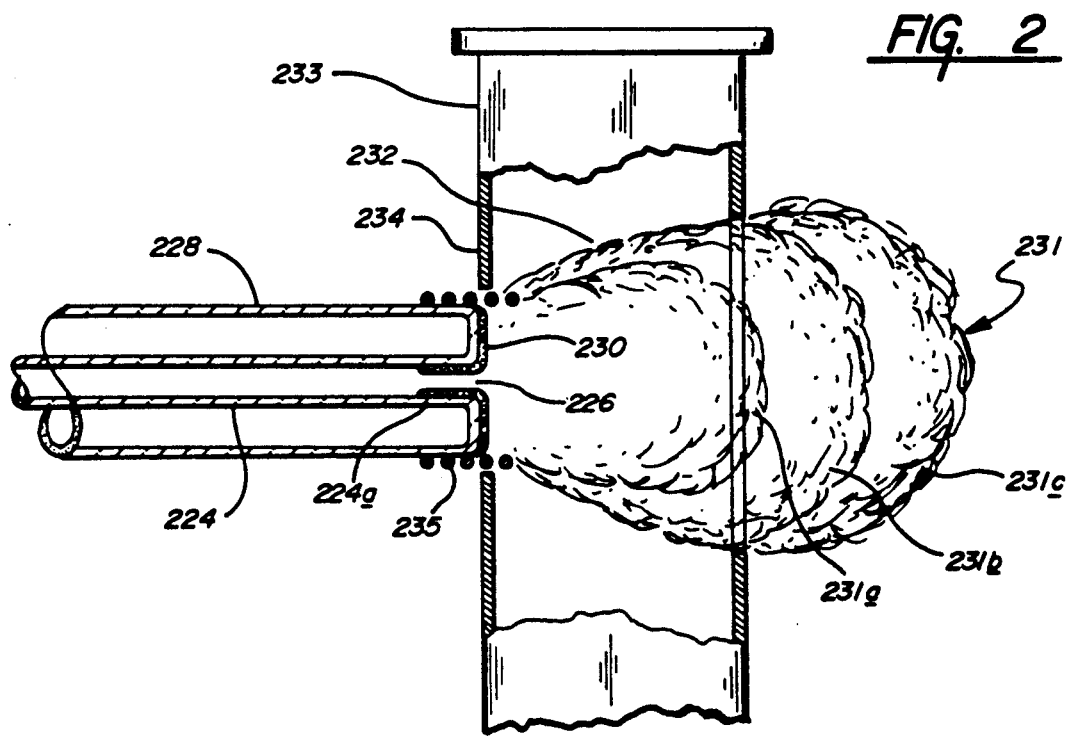
FIG. 2 is an enlarged, cross-sectional side view, partially cut-away, illustrating the position of the conduit, through which the deposition precursor gas is introduced into the enclosure, relative to the microwave applicator.

The conduit 24 may further include means for reducing the diameter thereof adjacent said aperture 26, which reducing means may, in one embodiment, simply take the form of an overcoat 230 as depicted in FIG. 2. By so reducing the flow path for the precursor deposition gas, it is possible to create a "choke condition" in the conduit 24 "adjacent" the aperture 26 so as to provide a localized high pressure of the precursor deposition gas. As used herein, the term "adjacent" the aperture means that choke condition is created sufficiently close to the aperture that the gas flowing through the aperture senses the effects of the transonic velocity thereby created. As used herein, the term "choke condition" refers to the condition which occurs when the speed of the precursor deposition gas passing through the aperture 26 in the conduit 24 reaches substantially transonic speed. The choke condition generally is that condition which occurs in compressible gas (or fluid) flow when, for a conduit of a uniform size, the speed of the gas passing through said conduit reaches transonic velocity. It is at this condition that any rise in the flow rate of the precursor deposition gas results in an increase in pressure rather than velocity. It is also this condition which defines the choke mode and it is precisely this effect which allows the pressure to be increased for operation at the substantial minimum of the Paschen curve. This localized high pressure creates a sufficient pressure zone for the precursor deposition gas flowing through the conduit adjacent the distal end 24a so that a plasma may be initiated and maintained at a power level which can be independently controlled. In an alternative embodiment, the pressure within the distal end 24a of the conduit 24 may be easily controlled by employing an electromechanical device, such as a solenoid, which device may be selectively constricted or relaxed so as to regulate the flow rate of precursor deposition gas passing therethrough and hence the pressure which exists adjacent said distal end 24a.

The conduit 24 may also include a coil, such as 235 depicted in FIG. 2, wrapped thereabout for providing an applied magnetic field immediately adjacent the distal end 24a. The applied magnetic field can be energized to increase the residence time of the activated species of the precursor deposition gas in a plasma zone which is created immediately adjacent the aperture 26 of the conduit 24. As will become more apparent from the description which follows hereinafter, while the magnetic field established by the coil 235 serves to increase the residency time of the ionized species created by the microwave applicator to the immediate vicinity of the aperture portion of the conduit, said magnetic field does not significantly spatially confine the plume of activated species.

Turning now in greater detail to FIG. 2, there is illustrated therein preferred embodiment of the conduit 24 discussed with respect to FIG. 1. FIG. 2 specifically depicts one preferred embodiment, wherein the conduit 224 is fabricated from a material which is not microwave transmissive, such as stainless steel or a like microwave reflecting metal. As in the FIG. 1 embodiment, the conduit 224 includes at least one portion, the distal end 224a thereof, having an aperture 226 formed therein. The non-transmissive conduit 224 also includes an external, concentrically disposed cooling jacket 228 wrapped thereabout, which jacket is adapted to facilitate the circulation of a cooling medium, such as water, therethrough. In this manner, the cooling jacket 228 is able to maintain said conduit 224 at a uniform, relatively low temperature despite the intense heat generated by the highly energetic, activated species created at said distal end of said conduit by, for instance, microwave energy or r.f. electromagnetic fields. Aside from water, the cooling medium may also be selected from the group of fluids consisting essentially of silicone oil, freon, nitrogen, hydrogen, helium, and other cooling media well known to those ordinarily skilled in the art.

More particularly, the cooling jacket 228 is necessitated due to the heat which is generated by the intensity of the activation region initiated and sustained adjacent said aperture 226 at the distal end of said conduit. Note that the precursor deposition gas effusing from said aperture 226 of the conduit 224 is subjected to the intense electromagnetic field created by the microwave energy transmitted through the radiant microwave applicator. The intense electromagnetic field disassociates the precursor deposition gas. It is the subsequent chemical reaction of dissociated species which liberates heat resulting in the build-up of very high temperatures as well as the formation of a highly reactive plasma of activated species of the precursor deposition gas. Accordingly, the distal end 224a of the conduit 224 reach temperatures sufficient to melt the material from which the conduit is fabricated. If not for the presence of the cooling jacket 228, this material could decompose due to the extremely high temperature conditions and become a source of contaminants within the vacuumized enclosure. These contaminants would ultimately degrade the quality of the plasma activation process due to the deposition of contaminated material onto the substrate.

The conduit 224, depicted in FIG. 2, further has affixed to the distal end 224a thereof the protective overcoat 230 formed of a high temperature resistant, sputter resistant, relatively benign material. This protective overcoat 230 is adapted to protect the material from which the distal end 224a of the conduit 224 is fabricated, from degradation resulting from the sputtering thereof by the high temperature, highly energetic, activated species of the precursor deposition gas.

Note that, and as will be specified in detail hereinafter, the activated precursor species of the precursor deposition gas forms a plume, generally 231, of pressure isobars adjacent the aperture of the conduit 224, which plume 231 includes an activation region of activated species. As will also be detailed hereinafter, the boundaries of the plume of activated species are specified by the pressure differential which exists between the gas flowing through the interior of the conduit and the background pressure existing in the interior of the enclosure. In a preferred embodiment, graphite is employed as the material from which the protective overcoat 230 is fabricated. (It is essential to understand that the graphite overcoat does not affect the fact that the plasma created by the substantial pressure differential of the instant invention is confined without the presence of structural walls. The lack of structural confinement is defined as confinement downstream of the point at which the gas is introduced into the interior of the vacuum enclosure from the aperture in the conduit.) Graphite is not only highly resistant to high temperature and high temperature sputtering processes, but when the apparatus 10 is employed for the deposition of semiconductor alloy materials, graphite is substantially electrically benign to the desired characteristics of that deposited semiconductor film.

As was mentioned hereinabove, and as is more particularly illustrated in FIG. 2, the conduit 224 is adapted to introduce the preferred deposition gas flowing therethrough into the hollow interior of the activation means 232, which activation means is located immediately adjacent said aperture 226. The conduit 224 with the concentrically disposed cooling jacket 228 wrapped thereabout is spacedly positioned adjacent an aperture 234 formed in side wall 233 of said activation means 232. The diameter of the preferably circularly shaped (although other shapes can be employed with equal success) aperture 234 is about ¼ to one inch larger than the outer diameter of the cooling jacket 228, so as to facilitate the passage of the preferred deposition gas directly into the interior of said activation means 232, while providing an adequate insulating space between the side wall 233 of the activation means 232 and the periphery of the concentrically disposed conduit and cooling jacket so as to prevent sparking or other electrical coupling therebetween.

As should be readily appreciated from a perusal of the embodiment depicted in FIG. 2, the conduit 224 and the cooling jacket 228 do not actually extend into the interior of the activation means 232. This is because, if the conduit 224 were to be positioned interiorly of the hollow, rectangularly shaped applicator while the conduit 224 and the cooling jacket 228 were fabricated of materials which were non-transmissive to microwave energy the microwave energy would be absorbed by those materials. However, since the conduit 224 is positioned (in FIG. 2) exteriorly of, but adjacent the side wall 233 of the radiant microwave applicator 232, (1) the non-transmissive materials from which the applicator is fabricated does not interfere with plasma coupling and (2) the activated species of the precursor deposition gas are primarily generated outside of the aperture 226 formed in the distal end of said conduit 224. Further, due to the protective overcoat 230 affixed thereto, degradation of the surface material of that conduit is prevented. Note that the conduit 224 can be moved into the interior of the waveguide a distance of about one half inch for purposes of efficiently coupling the microwave energy into the plasma.

Returning now to FIG. 1, the deposition apparatus 10 further includes the aforementioned microwave applicator 28, which applicator is adapted to deliver electromagnetic energy at 2.45 GHz to the energy transferring gas flowing through the first conduit 24. While the applicator 28 is depicted as a radiant microwave applicator, said applicator may be selected to deliver any type of energy selected from the group consisting essentially of microwave energy, r.f. energy, low frequency a.c. energy, or photo-energy in the form of a high intensity pulsed laser. However, and as previously mentioned, since microwave energy can most effectively provide a high density, large volume plasma of activated species, the applicator 28 is preferably formed as a microwave applicator, preferably a radiant microwave applicator (as opposed to slow-wave applicator) adapted to transmit at least 1.0 kilowatt of microwave power and preferably 5 kilowatts or more of microwave power at a frequency of 2.45 GHz.

As clearly depicted in FIG. 1, said applicator 28 is an elongated, hollow, generally rectangularly shaped waveguide structure adapted to transmit microwave energy from a magnetron (not shown) to the precursor deposition gas introduced into the enclosure from the conduit 24. Said waveguide applicator 28 enters said enclosure 12 through a microwave transmissive window 29, which window is vacuum sealed to a bottom face 12c of the enclosure. This type of vacuum sealed window 29 is fully disclosed in commonly assigned U.S. Pat. application Ser. No. 179,617 filed Apr. 8, 1988, the disclosure of which is incorporated herein by reference. The microwave applicator 28 is seated upon the upper, interior plate 29a of that window 29. The waveguide structure is preferably formed of copper outside of the vacuum enclosure and nickel inside said enclosure.

In order to achieve the function of coupling the introduced microwave energy to the introduced precursor deposition gas, the conduit 24 extends through an aperture 30 formed in the side face 32 of the waveguide 28 for receiving the precursor deposition gas. Therefore, the structure and function of the aperture 30 is identical to that depicted in and described with reference to FIGS. 2 and 3. Accordingly, the aperture 30 is adapted to facilitate the passage of the conduit 24 and the precursor deposition gas carried therewithin into an activation region 34 formed adjacent the distal end 24a of the conduit 24 so that the plume of activated species extends from the interior of said applicator 28.

The radiant microwave applicator 28 further includes cut-away section 36 formed in the face 35 thereof opposite the face 32 in which the aperture 30 is formed. The cut-away section 36 has a diameter larger than the diameter of the aperture 30 and preferably at least about 2 inches so as to provide for the movement of expanding pressure isobars (231a–c in FIG. 2 and 331a–c in FIG. 3) of the plume of activated species without having those activated species degrade too much of the microwave applicator material. It should therefore be understood that the applicator cut-away section 36 is adapted to provide a means of escape for the activated species of the precursor deposition gas from within said applicator 28. The microwave applicator 28 further includes a closed end plate 40 to prevent the escape of unused microwave energy into the interior of the vacuumized enclosure 12. It is to be noted that the maximum size of the cut-away section 36 of face 35 of the applicator 28 will be determined by balancing the facts that (1) the smaller the opening is made, the more material therefrom will be etched away or the more activated species will be lost, but the more the microwave energy is confined; while (2) the larger the opening is made, the less material is etched therefrom or less activated species will be lost, but the more the microwave energy leaks into the enclosure. The cutaway section 36 may further include a microwave absorptive or reflective screen or other means adapted to prevent the microwave energy from entering the enclosure. This becomes particularly significant as the pressure differential between the background pressure and the pressure of the energy transferring gas in the first conduit is reduced to approach the aforementioned factor of at least 5.

The deposition apparatus 10 further includes at least one remotely located, generally planar substrate 50 operatively disposed within the enclosure 12 and at least spaced a distance from the distal end 24a of the conduit 24 sufficient to prevent said thin film material depositing thereupon from direct exposure to the high energy electrons present in the plume of activated species 34. The apparatus 10 may further preferably include means 52 adapted to heat and or apply an electrical or magnetic bias to the substrate 50. It is to be understood, however, that the use of heat or a bias is not required to practice the invention disclosed herein. In a preferred embodiment, the substrate 50 is operatively disposed so as to be substantially aligned with the conduit 24 so that a flux of the activated species generated in the activation region 34 can be directed thereat for deposition thereupon.

It is important to note, and as previously mentioned, the substrate 50 is operatively disposed a given distance from the aperture 26 and the conduit 24 as well as the end of the plume 34 of activated species of the precursor deposition gas. This spacing of the substrate 50 from the aperture 26 is judiciously selected so that a desired number of inter-collisions occur between the activated species. It is therefore to be understood that the length of this region, hereinafter referred to by the reference numeral 65 and referred to as the interactive directed drift zone, is dependent upon the mean free path of the activated species, the background pressure existing in the chamber, the flow rate of the precursor deposition gas in the conduit, the energy imparted to the activated species in the activation region, and the specific precursor deposition gas being employed. Applicants have determined that one optimum length for this drift zone is approximately 12 centimeters from the aperture of the conduit. However, through the use of other techniques, the substrate may be moved closer or farther away from the aperture of the conduit without significantly effecting the quality of the depositing film. For instance, an "air-brake" 67 may be interposed between the substrate and the conduit. This air-brake 67 serves to structurally confine the activated species as they travel through the drift zone. Of course, the length and circumferential extent of the walls from which the air-brake is formed may vary anywhere from a very small circumference to a complete circular enclosure so as to form a cylindrical member totally encapsulating those activated species. As the degree of enclosure increases, the pressure increases and a number of collisions between the activated species also increases with a resulting change in the quality of depositing material.

At this point, several observations must be made. The instant inventors do not as yet fully understand all of nuances of the instant invention. There remains a question as to whether the resultant deposition species are identical if the speed with which the activated species traverse the drift zone is decreased through the use of an air-brake or if the length of the drift zone is correspondingly lengthened. This is because the air-brake necessarily causes an increased number of activated species-wall collisions as well as an increased number of activated species collisions with one another. The one factor which the instant inventors do believe is necessary is that the substrate be maintained remote of the extent of the plume of activated species. If the substrate is actually positioned within the plume of activated species, the morphology of the depositing material become columnar and porous and material properties degrade significantly. This is fully consistent with the reported growth mechanisms of amorphous silicon material reported by Tsai and Shaw, et al in *Material Research Society Symposium,* Proc. Vol. 95, 1987 in an article entitled "Film Growth Mechanism of Amorphous Silicon and Diode and Triode Glow Discharge Systems", page 219. However, as was detailed hereinabove and will be more fully described hereinafter, the instant inventors have demonstrated through the data provided in FIG. 4 that it is possible to obtain material of at least the same quality despite an increase in deposition rate and power. This is not only significant but revolutionary in the deposition of thin films through plasma processes. Due to the data reported herein, the instant inventors believe that it is possible to deposit materials at tremendously high rates of deposition and still obtain electronic, optical or other desired properties which are at least as good as those materials deposited at very low deposition rates.

II. THE METHOD OF THE INSTANT INVENTION

Before providing the specifics of the critical parameters which relate to the practice of this method, the crucial question to be asked is how the (what has been termed) "novel" direct excitation with a remotely located substrate process of the instant invention differs from the direct excitation work heretofore employed by other skilled researchers in the field. The answer, which will be further expounded upon in the pages which follow, is that the instant inventors employ a significant pressure differential between the pressure adjacent the aperture in the conduit and the background pressure which exists in the vacuumized enclosure. It is this pressure differential which differentiates the work described herein from Drs. Knights and Tsai, as well as the work of all other published researchers of which the instant inventors are aware. Unfortunately, it is impossible, due to all of the parameters which must be considered to place a numerical value on the pressure differential which must exist in order to generate the high flux of activated species described herein; however, two simple manners of differentiating over other direct excitation processes do exist.

In the direct excitation process described herein and due to the pressure differential which exists, the volume occupied by the plume of activated species (which is about 10 torr at the core) can be is spaced, without structural, electrical or magnetic confinement, from the substrate. In marked contrast thereto, in all other remote or direct excitation processes, because the plasma region and the deposition region are maintained at substantially identical pressures, the plasma of activated species of the precursor deposition gas must be structurally, electrically and/or magnetically separated from the substrate. The second manner in which the instant invention differentiates over the prior art is by maintaining a choke condition in the conduit through which the precursor deposition gas flows and is introduced into the interior of the the enclosure. This choke condition determines that the velocity of the precursor deposition gas will be transonic.

In operation, the method of the subject invention is carried out in a vacuumized enclosure or chamber of the type generally described with reference to FIG. 1. The vacuumized enclosure is first evacuated to a background pressure which, in conjunction with the substantially transonic flow rate of the precursor deposition gas interiorly of the conduit, will allow for the subsequent initiation and maintenance of a plasma of activated species of the precursor deposition gas, which plasma has been controlled to occur at the substantial minimum of the Paschen curve. It therefore becomes critical to select a pump which is sufficiently powerful to evacuate the enclosure to the low background pressure, despite the high flow rate of precursor deposition gas constantly introduced thereinto. In one preferred embodiment, the pump is capable of evacuating to and maintaining the enclosure at a background pressure of less than about 50 torr, and preferably in the range of approximately 0.01 mtorr to 10 7 torr, although the background pressure need not be limited to any given value. Because of these operating conditions, and the hard vacuum already present in outer space, the apparatus disclosed herein could be readily adapted to "spray", at a high rate of deposition, a radiation hard coating of silicon oxide onto objects such as space stations. For instance a flexible conduit could introduce silicon and oxygen-containing gases, while X-band microwaves could be transmitted along flexible waveguides for exciting those silicon and oxygen precursors for depositing a silicon-oxide film.

Therefore, it should now be appreciated that each parameter (which relates to the attainment of a high flux of activated precursor species) can be independently controlled. Firstly, the microwave applicator power can be controlled to provide the density plume of activated precursor species. Secondly, since no structural, electrical or magnetic confinement exists and since the flow of the precursor deposition gas is transonic, the loss of desired activated species due to collisions of activated species with walls prior to reaching the substrate is substantially eliminated and the desired activated species are efficiently transported to said substrate region within the lifetime thereof. Thirdly, the background pressure, the power level and the substrate-to-aperture distance can be independently selected to optimize the reactions taking place to deposit desired activated species onto the substrate.

As specifically described, there is introduced into the interior of the vacuumized enclosure, inter alia, the precursor deposition gas, which introduction is accomplished by a conduit preferably having at least one aperture formed at the distal end thereof. The aperture is typically dimensioned to have a diameter of between about 0.25 to 3.0 cm and may be equipped with a solenoid operated aperture reduction structure and/or a protective overcoat, both of which elements have been fully described hereinabove.

In addition to the primary precursor, the precursor deposition gas may include a number of diluent or dopant gases including, but not limited to, $O_2$, $NH_3$, $N_2$, $NH_4$, $H_2$, $CH_4$, $PH_3$, $PH_5$, $BF_3$, $BF_5$, $B_2H_6$, $BH_4$, and combinations thereof. The function of the diluent or dopant gas is to provide a source of an element to be incorporated into the deposited film. For example, if a thin film of silicon:germanium alloy material is being deposited upon the spacedly disposed substrate, the film may be rendered slightly p-type by the addition of small amounts of a p-type dopant, such as $BF_3$, into the flow of the precursor deposition gas. Alternatively, in the deposition of a layer of insulating $SiO_x$ material, it will be necessary to include small amounts oxygen in the stream of the precursor deposition gas. Regardless of composition, it is important that the precursor deposition gas be delivered through said conduit to a point immediately adjacent the activation means, such as directly into the interior of the radiant microwave applicator discussed hereinabove.

While the activation energy may be selected from the group consisting of a.c. energy, r.f. energy, microwave energy, photoactivation energy, and combinations thereof, in a preferred embodiment, the activation energy is microwave energy and the activation means is a radiant microwave applicator, such as the aforementioned radiant microwave waveguide which extends into the interior of the vacuumized enclosure. The radiant microwave applicator is adapted to provide about 0.5-10 kilowatts of microwave power at a frequency of 2.45 GHz. The precursor deposition gas is delivered from the aperture in the conduit through an opening formed in the side wall of the microwave applicator into an activation region located within the hollow interior of said applicator. The activation region is clearly defined as that region of the enclosure in which activated species of the energy transferring gas is formed. The pressure adjacent the aperture of the conduit created by the high flow rate of the deposition precursor gas exiting the conduit relative to the background pressure within the enclosure also serves to generate a series of concentric pressure isobars which limit, without structural, electrical or magnetic confinement, the volume occupied by the plume of the activated species of that deposition precursor gas.

The deposition precursor gas is preferably delivered from the conduit into the enclosure at a flow rate of at least about 100 SCCM, and more preferably approximately between 100-2000 SCCM. In this way, it is possible to maintain a preferred pressure differential of at least about a factor of five between the background pressure that exists within the interior of the enclosure (less than about 50 torr, and preferably 0.1-10 mtorr) and the pressure of the deposition precursor gas proximate the aperture of the conduit (which pressure may be as high as about 10-30 torr). It should be apparent that the pressure within any given isobar decreases with distance away from the aperture in the conduit. Therefore, at any given power, the Paschen curve will provide a pressure-determined boundary of the activation region.

Figure 3:
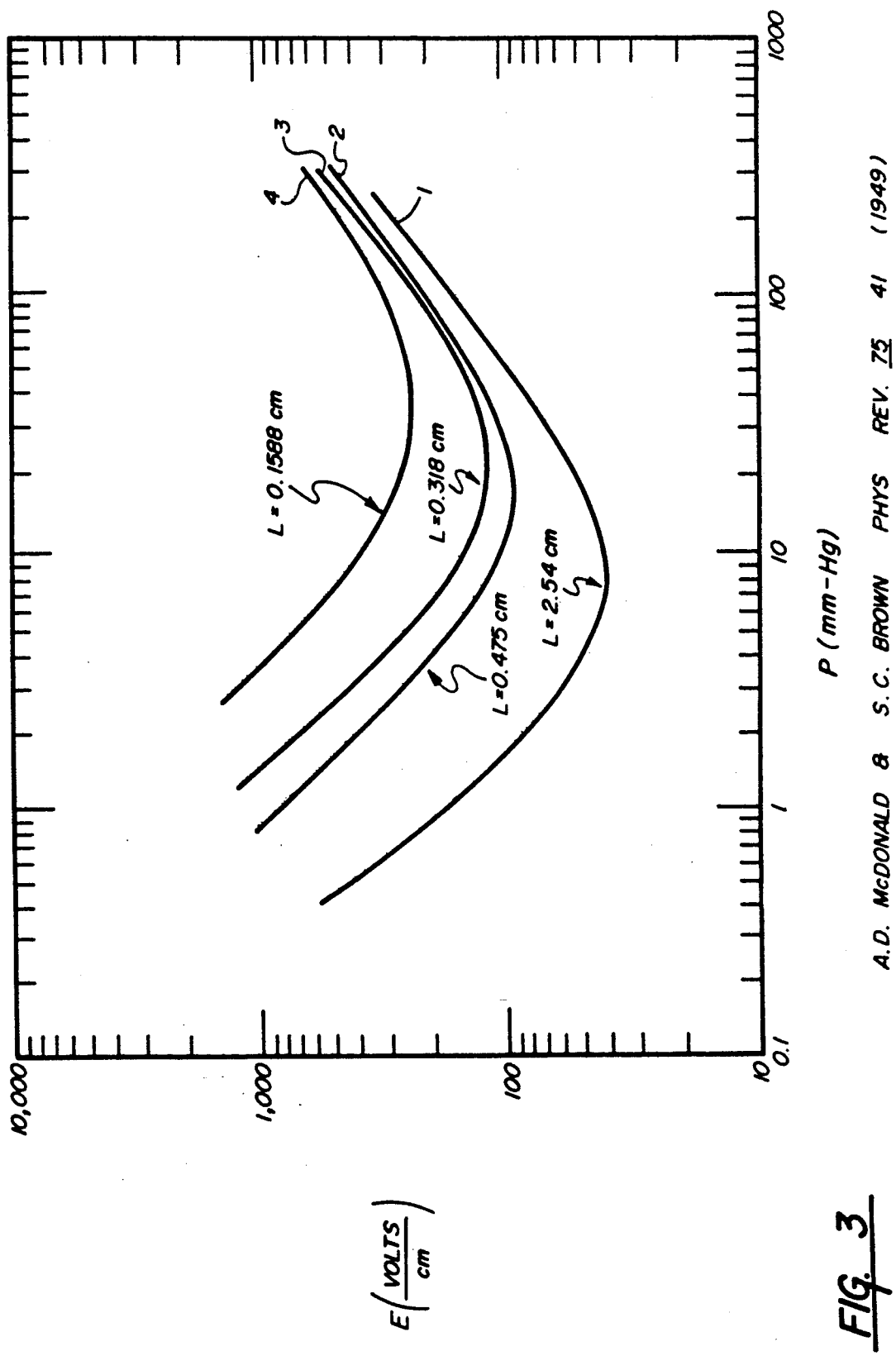
FIG. 3 is a graphic representation of modified Paschen curves, for different volume plumes of activated species, the curves having pressure displayed on the abscissa and power displayed on the ordinate, which Paschen curves are reproduced from an article by A.D. MacDonald, and S.C. Brown, published in Physical Review, Vol. 75, p. 411, (1949)
Figure 4:
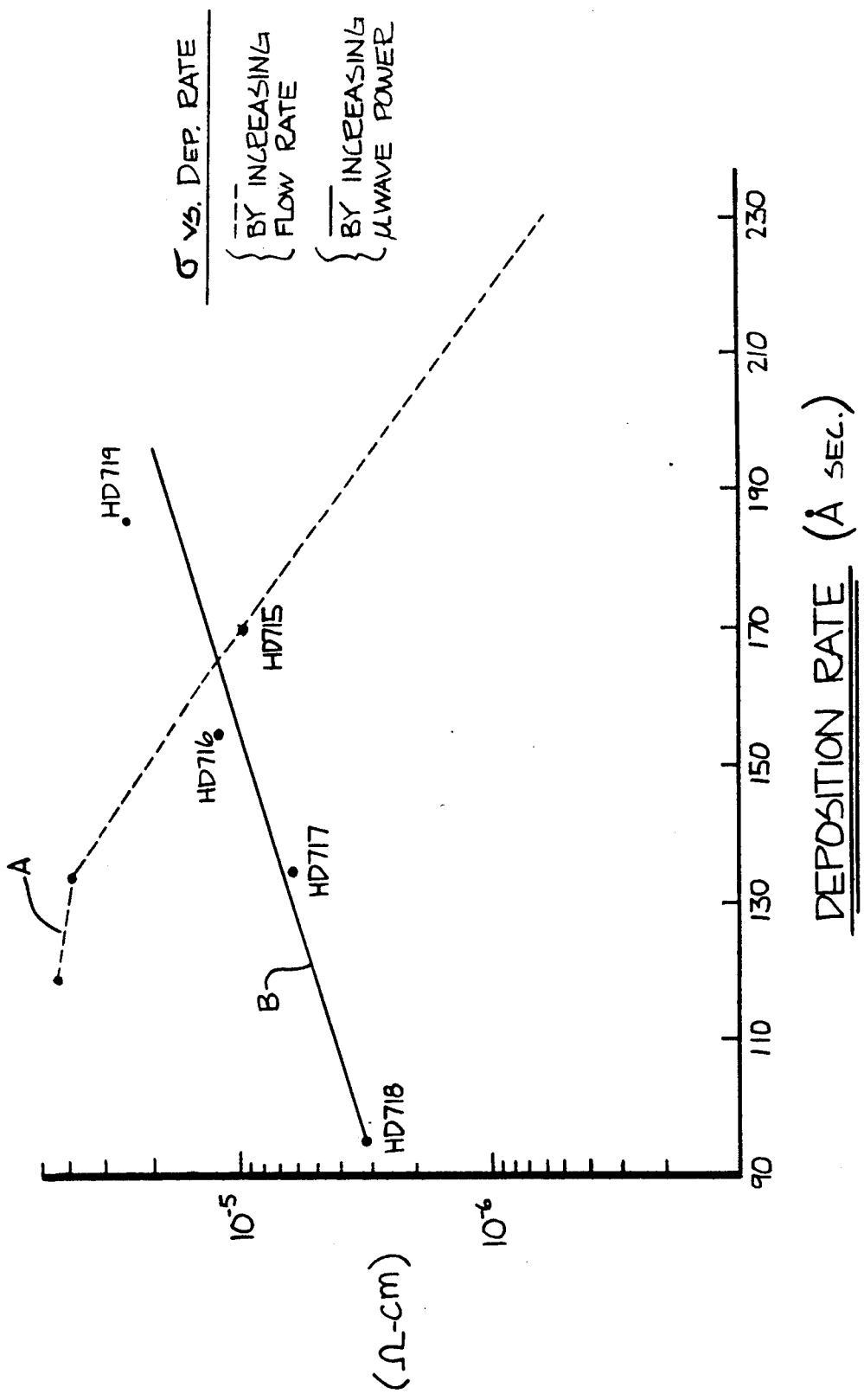
FIG. 4 is a graphic representation in which light conductivity ((as measured in inverse (ohm-cm)) is plotted on the ordinate and deposition rate (as measured in Angstroms per second) is plotted on the abscissa for the deposition of an amorphous silicon film in which for Curve B the gas flow rate of the precursor deposition gas is held constant while the microwave power is increased, and for Curve A the microwave power is held constant while the gas flow rate of the precursor deposition gas is increased.

Additionally, and as may be appreciated from a perusal of FIG. 3, the pressure of the activated species of deposition precursor gas within a plume of a given volume determines the power level which must be applied to form a plasma therefrom. In that regard, FIG. 4 depicts a series of discrete Paschen curves (numbered 1-4) for initiating and sustaining plasmas which occupy varying volumes. Plotted along the abscissa of the FIG. 4 graph is the pressure of the activated species of the energy transferring gas within a given isobar, in mm-Hg (where 1 mm Hg=1 torr) and plotted along the ordinate is the field applied in volts/cm. Each Paschen curve is unique to a plume of a given volume. For example, curve 1 describes the pressure/power regime required for a generally spherically shaped plume, the volume of which can be calculated given the diameter (L) equal to 2.54 cm. By operation at the minimum of the Paschen curve, minor variations of pressure can be accommodated without falling off the curve and having the plasma extinguished.

For instance, in order to operate at the substantial minimum of Paschen curve 1 (the most efficient regime in which to operate), a pressure of approximately 10 torr and an electric field, a measure of power, of approximately 40 volts/cm is required. Note that in selecting the correct pressure-power regime in which to operate, it is necessary to select the proper volume plume and/or aperture size out of the discrete continuum of Paschen curves. In selecting this volume, and as can be best seen from FIG. 2, the plume of activated species 231 is made up of a plurality of pressure isobars, such as 231a-231c. It must be appreciated that the pressure of the deposition precursor gas introduced into the enclosure is substantially equalized with the background pressure over a given radial distance from the point of introduction at the mouth of the aperture 226. For instance, the difference in pressure between the inner isobar and the background pressure may represent a drop of 10 torr. Of course, when the pressure differential becomes sufficiently small, the plume boundary is defined and the density of activated species melds into the background density of activated species.

After evacuating the enclosure, applying the electromagnetic field of microwave energy by means of the radiant microwave applicator and introducing a sufficient flow of the precursor deposition gas, ignite a plasma of activated species from the high density of the precursor deposition gas residing within the activation region; activated species of the precursor deposition gas travel towards the interactive, directed drift zone 65 illustrated in FIG. 1. The activated species of the precursor deposition gas may have some direction velocity imparted thereto which moves them towards the drift zone due to the high flow rate of the precursor deposition gas exiting from the conduit as compared to the background pressure existing within the enclosure. The velocity which the flow rate imparts to the precursor deposition gas is, at least initially, transonic.

In the drift zone, activated species of the precursor deposition gas collide with one another (or walls of an air-brake which may also be provided) so as to generate a large percentage of $SiH_3$ (relative to other undesired activated precursor species such as $SiH_2$, SiH and Si which is reported in the literature to represent the desirable deposition species for obtaining high quality (low defect density) amorphous silicon alloy material. If the drift zone is too short, the instant inventors hypothesize that a sufficient number of collisions be inter-activated species cannot occur and the aforementioned undesirable species are deposited upon the exposed surface of the substrate. In this regard, the substrate must be spacedly positioned from the plasma region. However, the precise distance therefrom is dependent upon a number of factors such as, inter alia, (1) the relative pressure differential between the flow of precursor deposition gas in the conduit and the background pressure in the enclosure; (2) the composition of the precursor deposition gas; (3) the quality of the depositing film required; (4) the amount of power imparted to the plasma, and hence the degree of excitation of the discrete species; and (5) the transit time in which the activated species are able to reach the substrate surface With respect to point (5), note that the transit time can be varied by, for instance, the incorporation of an air-brake about the path of travel of the activated species so as to insure collisions thereof with the air-brake walls. The limiting factor is that the substrate cannot be in direct contact with the plasma.

With respect to the number of collisions which occur and as is well known to those skilled in the art, the length of the mean free path of the energized deposition species is directly dependent upon the background pressure existing within the vacuumized enclosure through which those species will diffuse. For example, if the background pressure within the enclosure were relatively high, i.e., approximately one torr, the mean free path of the energized deposition species would be quite short (on the order of 1 mm or less). If on the other hand, the background pressure of the vacuumized enclosure is maintained at substantially sub-atmospheric levels, as approximately 1 millitorr, the mean free path of the energized deposition species will be considerably longer, on the order of 5-10 cm. It can thus be appreciated that the size of the substrate upon which the energized deposition species is to be deposited, will be one of the critical factors used in determining the length of the mean free path, and correspondingly, the background pressure at which the vacuumized enclosure must be maintained.

It should be equally apparent that once the background pressure of the vacuumized enclosure is determined, and the deposition rate is selected, each of the other parameters critical in initiating a plume of a given volume of activated species of the deposition precursor gas are likewise determined. As was discussed hereinabove, as a rule of thumb, the flow rate of the deposition precursor gas through the conduit must be sufficient to create a pressure differential of at least about a factor of five between the deposition precursor gas and the background pressure of the vacuumized enclosure for the uniform deposition of energized deposition species onto a substrate having a surface area of about 100 square cm. Thus, knowing the required length of the mean free path, the background pressure may be selected, and this background pressure dictates the possible range of flow rates at which the deposition precursor gas must be introduced into the enclosure in order to maintain a significant pressure differential between the background pressure and the flow within the first conduit. This also determines the size of the aperture which will provide transonic flow at that flow rate of deposition precursor gas.

Taking the usable range of flow rates of the deposition precursor gas for a given background pressure, it then becomes possible to return to the Paschen curve illustrated in FIG. 4 to determine an optimized power/pressure regime in which to operate for a given volume of activated species. At a given power/pressure/aperture size regime, it is possible to determine the approximate percentage of the deposition precursor gas which has been excited to form the activated species. By maintaining the appropriate pressure differential between the background pressure in the enclosure in the enclosure and the substantially transonic flow rate of the deposition precursor gas in the conduit, it is possible to impart a velocity to the activated species of the deposition precursor gas which is greater than the inherent thermal velocity of the activated species, thereby imparting a directional momentum to those activated species. This momentum directs said activated species toward the substrate in a substantially uniform, non-random manner.

Finally, and as was discussed hereinabove, by maintaining a sufficiently low background pressure, it is possible to optimize the number of collisions (the mean free path) between energized deposition species prior to the deposition thereof upon the exposed surface of the substrate. The principles of the instant invention have also substantially eliminated the inadequacies in film quality observed in films produced by prior art RPECVD apparatus. This is achieved, in part, by preventing the creation of undesired deposition species.

In order to place the importance of the instant invention in true perspective, the instant inventors, utilizing the principles disclosed herein, have (1) deposited high quality amorphous silicon alloy material at rates of as high as 240 Angstroms per second (two orders of magnitude higher than r.f. PECVD processes and a factor of two higher than microwave PECVD processes); (2) have deposited silicon alloy material exhibiting better than 5 orders of magnitude of photoconductivity; and have deposited silicon alloy material characterized by a density of defect states of about $10^{16}$ defects/cm$^{-3}$/eV. And in direct contrast to published papers, the instant inventors have proven that the quality of the deposited material actually improves with the rate of deposition thereof. Further, the inventors believe that the quality of the material will continue to improve as more power can be coupled to excite the precursor deposition gas and as the amount of sputtered waveguide or graphite material are reduced.

The instant inventors have expounded at length as to the ability of the process described herein to fabricate high quality thin film material at high rates of deposition. Not only do the instant inventors claim that the results of this invention are in direct contrast to the conclusions drawn by the research of, for instance, the Xerox PARC group, but also that the results of this invention is synergistic in nature. It therefore becomes incumbent upon the instant inventors to demonstrate the truth of their assertions. To that end, reference is now made specifically to FIG. 4 which is a graphic representation wherein the light conductivity (as measured in units of inverse ohm-cm.) is plotted on the ordinate and the rate of deposition (as measured in units of Angstroms per second) is plotted on the abscissa. (Note all of the samples plotted on the graph exhibited substantially identical dark conductivities.) The data plotted on the graph of FIG. 4 was obtained using the apparatus illustrated in FIG. 1 to deposit amorphous silicon alloy material through the direct exitation, remote substrate deposition process described in detail hereinabove. The reader, will, by this time, appreciate that this remote substrate, direct exitation process requires the establishment of a significant pressure differential between the pressure which exists adjacent the aperture in the conduit and the background pressure which exists in the evacuated enclosure.

The two curves illustrated in FIG. 4 reflect the fact that are two ways of increasing the rate of deposition in the remote substrate-direct excitation system system depicted in FIG. 1. Curve A relates to the first manner of increasing the rate of deposition, namely by increasing the flow rate of the precursor deposition gas (silane) introduced into the enclosure through the aperture in the conduit, while keeping the power (microwave power) introduced to activate that precursor deposition gas constant. It should be apparent that the deposition rate will increase as the flow rate of the precursor deposition gas is increased. Further, as suggested by the aforementioned research of others in the field, the quality of the deposited amorphous silicon material should deteriorate in correspondence to the increased rate of deposition. This is borne out by Curve A. particular, the deposited silicon material exhibited a light conductivity of about $4.5 \times 10^{-5}$ inverse ohm-cm. at a deposition rate of 120 Angstroms per second, said conductivity decreasing to about $4.5 \times 10^{-7}$ inverse ohm-cm. at a deposition rate of about 240 Angstroms per second.

The synergistic finding of the instant invention is demonstrated by the results depicted in Curve B of FIG. 4. Curve B illustrates the second manner of increasing the rate of deposition, namely by increasing the power (microwave power) delivered to activate the precursor deposition gas (silane) while keeping the flow rate of that precursor deposition gas constant. In direct contradistinction to the results of the other researchers, the quality of the deposited amorphous silicon material improved in correspondence to the increased rate of deposition when occasioned by the increase of power supplied to activate the precursor deposition gas. Specifically, the deposited silicon material exhibited a light conductivity of about $3 \times 10^{-6}$ inverse ohm-cm. at a deposition rate of about 95 Angstroms per second, said conductivity improving to about $2.5 \times 10^{-5}$ inverse ohm-cm. at a deposition rate of about 185 Angstroms per second. And importantly, as evidenced by the slope of Curve B, the quality of that amorphous silicon material does not as yet appear to be maximized and should continue to improve as more power is introduced to energize the precursor deposition gas and the deposition rate is thereby further increased. In this regard, note that at the present time, more power could not be introduced due to the inherent limitations in the power supplies, themselves.

One final point need be made. The experimental results obtained and explained hereinabove do not necessarily conflict with the experimental results obtained by Xerox PARC, but only with the conclusions drawn from those results by Xerox PARC. In other words, the findings of the instant inventors concur with those of Xerox PARC to the extent that desired deposition species such as $SiH_3$ have a lower sticking coefficient than undesired deposition species, such as $SiH_2$. However, other important characteristics were not considered by Xerox PARC, such as the lifetime of both desired and undesired species. The instant inventors submit that it is possible to deposit high quality thin films at high deposition rates by controlling the mean free paths of both desired and undesired species, which control the Xerox PARC researchers were unable to provide. Thus, while the instant inventors concur in the experimental results of Xerox PARC, they cannot agree that a fundamental incompatibility exists between the deposition of high quality material, and high deposition rates.

Prior to completing this discussion, it must once again be noted that the "critical" pressure differential which must be maintained, as well as the "critical" deposition rate made possible through the use of the method described herein have been rather arbitrarily selected. Since the pressure differential is dependent on such parameters as background pressure, size of the substrate, size of the aperture in the conduit, amount of power supplied, gases utilized, etc., no universal value can be calculated. The value of "about a factor of five" has been selected and used in the claims because it is sufficiently great to constitute a substantially universal truth. However, the instant inventors adamantly state their intention to be bound only by the broader principles espoused herein and not by such specific numerical values.

It should be recognized that the foregoing description and discussion are merely meant to illustrate the principles of the instant invention and not meant to be a limitation upon the practice thereof. It is the following claims, including all equivalents, which are meant to define the true scope of the instant invention.

What is claimed is:

1. A method of depositing a high quality thin film at a relatively high rate of deposition, said method comprising the steps of:
    providing an enclosure;
    maintaining the interior of said enclosure at a subatmospheric background pressure;
    introducing a precursor deposition gas into the interior of said enclosure through at least one aperture formed in a conduit, said precursor deposition gas including silicon;
    activating said precursor deposition gas in a activation region so as to form a high density plume of activated precursor species;
    operatively disposing a substrate interiorly of said enclosure, said substrate spaced from said plume;
    establishing a sufficient flow of said precursor deposition gas adjacent said aperture in said conduit so as to define a substantially clear boundary of said plume of activated precursor species without the structural, electrical, or magnetic confinement thereof; and
    depositing a high quality thin film of silicon containing material at a relatively high rate from the activated precursor species.

2. A method as in claim 1, including a further step of establishing a flow of said precursor deposition gas adjacent said aperture in said conduit at substantially transonic velocity.

3. A method as in claim 2, including the further step of forming the size of said aperture relative to the size of said conduit so as to form a choke adjacent said aperture for providing said high density plume.

4. A method as in claim 3, including the further step of utilizing microwave energy to activate said deposition precursor gas.

5. A method as in claim 4, including the further step of operatively disposing the aperture portion of said conduit adjacent said activation region for activating said precursor deposition gas downstream of said choke.

6. A method as in claim 5, including the further steps of forming said conduit from a microwave non-transmissive material, whereby said activated precursor species are primarily initiated exteriorly of said conduit.

7. A method as in claim 1, including the further step of increasing the time of residency of said precursor deposition gas adjacent said aperture so as to increase the energy of said plume of activated precursor species.

8. A method as in claim 1, including the further step of circulating a coolant medium through a tube concentrically disposed about said conduit.

9. A method as in claim 1, including the further step of providing means for reducing degradation of the surface of said conduit adjacent said aperture.

10. A method as in claim 6, including the further step of providing a protective overcoat at least partially encapsulating the aperture portion of said conduit to reduce the degradation thereof.

11. A method as in claim 7, including the further step of selecting said protective overcoat from a substantially high temperature, sputter-resistant material.

12. A method as in claim 1, including the further step of selecting said precursor deposition gas from the group consisting essentially of a silicon-containing gas, a germanium-containing gas, a carbon-containing gas, a nitrogen-containing gas, an oxygen-containing gas, a p-dopant containing gas, an n-dopant containing gas, and combinations thereof.

13. A method as in claim 1, including the further step of disposing said substrate a distance from said plume so as to define a directed drift zone in which collisions of activated precursor species of said precursor deposition gas form one or more desired deposition species of said precursor deposition gas.

14. A method as in claim 13, including the further step of disposing means for increasing the residency time of the activated species in said drift zone.

15. A method as in claim 14, wherein the residency time increasing means is an air-brake.

16. A method as in claim 1, including the further step of utilizing r.f. energy to activate said deposition precursor gas.

17. A method as in claim 1, including the further step of maintaining the background pressure in said enclosure at least about a factor of five less than the pressure adjacent said aperture in said conduit, whereby a plume of pressure isobars is formed by the activated precursor species of said precursor deposition gas.

18. A method as in claim 1, including the further step of controlling the volume of said plume of activated precursor species by controlling the pressure differential existing between the background pressure in said enclosure and the pressure adjacent the aperture in said conduit.

19. A method as in claim 1, including the further step of maintaining the background pressure in said enclosure of less than about 50 torr.

20. A method as in claim 17, including the further step of introducing a flow rate of at least about 100 SCCM of said precursor deposition gas through said conduit into said enclosure.

21. A method as in claim 20, including the further step of introducing a flow rate of about 100 to 2000 SCCM of said precursor deposition gas through said conduit into said enclosure.

22. A method as in claim 1, including the further step of maintaining pressure isobars adjacent the aperture portion of said conduit of about one-half the pressure at which the substantial minimum of the Paschen curve for a given precursor deposition gas occurs.

23. A method of depositing a high quality thin film at a relatively high rate of deposition, said method comprising the steps of:
    providing an enclosure;
    maintaining the interior of said enclosure at a subatmospheric background pressure;
    introducing a precursor deposition gas into the interior of said enclosure through at least one aperture formed in a conduit, said precursor deposition including silicon;
    activating said precursor deposition gas in an activation region so as to form a high density plume of activated precursor species;
    operatively disposing a substrate interiorly of said enclosure, said substrate spaced from said plume;
    establishing a flow of said precursor deposition gas adjacent said aperture in said conduit at substantially transonic velocity; and
    depositing a high quality thin film of silicon containing material at a relatively high rate from the activated precursor species.

24. A method as in claim 23, including the further step of reducing the size of said aperture relative to the size of said conduit so as to form a choke adjacent said aperture for providing a high density plume of said activated precursor species.

25. A method as in claim 24, including the further step of utilizing microwave energy to activate said precursor deposition gas.

26. A method as in claim 25, including the further step of operatively disposing the aperture portion of said conduit adjacent said activation region for activating said precursor deposition gas downstream of said choke.

27. A method as in claim 26, including the further steps of forming said conduit from a microwave non-transmissive material, whereby said activated precursor species are primarily initiated exteriorly of said conduit.

28. A method as in claim 23, including the further step of increasing the time of residency of said precursor deposition gas adjacent said aperture so as to increase the energy of said plume of activated precursor species.

29. A method as in claim 23, including the further step of circulating a coolant medium through a tube concentrically disposed around said conduit.

30. A method as in claim 23, including the further step of providing means for reducing degradation of the surface of said conduit adjacent said aperture.

31. A method as in claim 30, including the further step of providing a protective overcoat at least partially encapsulating the aperture portion of said conduit to reduce the degradation thereof.

32. A method as in claim 31, including the further step of selecting said protective overcoat from a substantially high temperature, sputter-resistant material.

33. A method as in claim 23, including the further step of selecting said precursor deposition gas from the group consisting essentially of a silicon-containing gas, a germanium-containing gas, a carbon-containing gas, a nitrogen-containing gas, an oxygen-containing gas, a p-dopant containing gas, an n-dopant containing gas, and combinations thereof.

34. A method as in claim 23, including the further step of disposing said substrate means an operative distance from said plume so as to define a directed drift zone in which collisions of activated precursor species of said precursor deposition gas form on one more desired deposition species of said precursor deposition gas.

35. A method as in claim 34, including the further step of disposing means for increasing the residency time of the activated species in said drift zone.

36. A method as in claim 35, wherein the residency time increasing means is an air-brake.

37. A method as in claim 23, including the further step of utilizing r.f. energy to activate said precursor deposition gas.

38. A method as in claim 23, including the further step of maintaining the background pressure in said enclosure at least about a factor of five less than the pressure adjacent said aperture in said conduit, whereby a plume of pressure isobars is formed by the activated precursor species of said precursor deposition gas.

39. A method as in claim 23, including the further step of controlling the volume of said plume of activated precursor species by controlling the pressure differential existing between the background pressure in said enclosure and the pressure adjacent the aperture in said conduit.

40. A method as in claim 39, including the further step of maintaining the background pressure in said enclosure of less than about 50 torr.

41. A method as in claim 40, including the further step of introducing a flow rate of at least about 100 SCCM of said precursor deposition gas through said conduit into said enclosure.

42. A method as in claim 41, including the further step of introducing a flow rate of about 100 to 2000 SCCM of said precursor deposition gas through said conduit into said enclosure.

43. A method as in claim 23, including the further step of maintaining pressure isobars adjacent the aperture portion of said conduit of about one-half the pressure at which the substantial minimum of the Paschen curve for a given precursor deposition gas occurs.

44. A method of depositing a high quality thin film at a relatively high rate of deposition, said method comprising the steps of:
provided an enclosure;
maintaining the interior of said enclosure at a subatmospheric background pressure;
introducing a precursor deposition gas including silicon into the interior of said enclosure through at least one aperture formed in a conduit, said pressure at said aperture being at least a factor of five greater than said background pressure;
activating said precursor deposition gas in an activation region so as to form a high density plume of activated precursor species;
operatively disposing a substrate interiorly of said enclosure, said substrate spaced from said plume, whereby said activated precursor species react with one another prior to being deposited upon said substrate; and
depositing a high quality thin film of silicon containing material at a relatively high rate of deposition from the activated precursor species.

45. A method as in claim 44, including the further step of selecting the flow rate of precursor deposition gas in said conduit so as to provide a sufficient pressure of said precursor deposition gas adjacent said aperture for initiating a plasma from said precursor deposition gas at a power-pressure-aperture size regime which is at the substantial minimum of the Paschen curve.

46. A method as in claim 44, including the further step of forming the size of said aperture relative to the size of said conduit so as to form a choke adjacent said aperture for providing said high density plume.

47. A method as in claim 44, including the further step of increasing the time of residency of said precursor deposition gas adjacent said aperture so as to increase the energy of said activated precursor species.

48. A method as in claim 44, including the further step of circulating a coolant medium through a tube concentrically disposed about said conduit.

49. A method as in claim 44, including the further step of providing means for reducing degradation of the surface of said conduit adjacent said aperture.

50. A method as in claim 49, including the further step of providing a protective overcoat at least partially encapsulating the aperture portion of said conduit to reduce the degradation thereof.

51. A method as in claim 50, including the further step of selecting said protective overcoat from a substantially high temperature, sputter-resistant material.

52. A method as in claim 44, including the further step of selecting said precursor deposition gas from the group consisting essentially of a silicon-containing gas, a germanium-containing gas, a carbon-containing gas, a nitrogen-containing gas, an oxygen-containing gas, a p-dopant-containing gas, an n-dopant-containing gas, and combinations thereof.

53. A method as in claim 44, including the further step of disposing said substrate means a distance from said plume so as to define a directed drift zone in which collisions of activated precursor species of said precursor deposition gas form one or more desired deposition species of said precursor deposition gas.

54. A method as in claim 53, including the further step of disposing means for increasing the residency time of the activated species in said drift zone.

55. A method as in claim 54, wherein the residency time increasing means is an air-brake.

56. A method as in claim 44, including the further step of utilizing r.f. energy to activate said precursor deposition gas.

57. A method as in claim 44, including the further step of utilizing microwave energy to activate said precursor deposition gas.

58. A method as in claim 57, including the further step of operatively disposing the aperture portion of said conduit adjacent said activation region for activating said precursor deposition gas downstream of said choke.

59. A method as in claim 58, including the further step of forming said conduit from a microwave nontransmissive material, whereby said activated precursor species are primarily initiated exteriorly of said conduit.

60. A method as in claim 44, including the further step of applying an electromagnetic field to form said plume of activated precursor species, and limiting, without the use of structural or electrical confinement, the volume occupied by said plume of activated precursor species.

61. A method as in claim 44, including the further step of controlling the volume of said plume of activated precursor species by controlling the pressure differential existing between the background pressure in said enclosure and the pressure adjacent the aperture in said conduit.

62. A method as in claim 44, including the further step of maintaining the background pressure in said enclosure in the range of less than about 5 torr.

63. A method as in claim 62, including the further step of introducing a flow rate of at least about 100 SCCM of said precursor deposition gas through said conduit into said enclosure.

64. A method as in claim 63, including the further step of introducing a flow rate of about 100 to 2000 SCCM of said precursor deposition gas through said conduit into said enclosure.

65. A method as in claim 44, including the further step of maintaining pressure isobars adjacent the aperture portion of said conduit of about one-half the pressure at which the substantial minimum of the Paschen curve for a given precursor deposition gas occurs.

* * * * *